(12) United States Patent
Nakaji et al.

(10) Patent No.: US 7,020,375 B2
(45) Date of Patent: Mar. 28, 2006

(54) WAVEGUIDE LIGHT DETECTING ELEMENT

(75) Inventors: Masaharu Nakaji, Tokyo (JP); Eitaro Ishimura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 153 days.

(21) Appl. No.: 10/777,136

(22) Filed: Feb. 13, 2004

(65) Prior Publication Data

US 2005/0025443 A1    Feb. 3, 2005

(30) Foreign Application Priority Data

Jul. 29, 2003  (JP)  ............... 2003-281450

(51) Int. Cl.
*G02B 6/10* (2006.01)
(52) U.S. Cl. .......................... 385/131; 257/43
(58) Field of Classification Search ............... None
See application file for complete search history.

(56) References Cited

U.S. PATENT DOCUMENTS

| 6,737,718 B1* | 5/2004 | Takeuchi | 257/431 |
| 2002/0195616 A1* | 12/2002 | Bond | 257/186 |
| 2003/0098475 A1* | 5/2003 | Ueda | 257/233 |

FOREIGN PATENT DOCUMENTS

| JP | 10027921 A * | 1/1998 |
| JP | 10-125948 | 5/1998 |
| JP | 11284219 A * | 10/1999 |
| JP | 11-330536 | 11/1999 |

OTHER PUBLICATIONS

T. Ido et al., "Highly Efficient Lens-Less Coupling of High-Speed Waveguide Photodiode to SMF and its Application to an Extremely Thin-Surface-Mountable 10-Gbps Receiver Module", *OFC 2003*, pp. 66-67, vol. 1, Mar. 24, 2003.

Ishimura et al., "40Gbps Waveguide Photodiode for 1.3 μm/1.55 μm wavelength", *Extended abstract of presentation made Mar. 27, 2003 at The Japan Society of Applied Physics and Related Societies*.

Matsuoka et al.; "Properties of λ=1.5 μm 10Gb/s Waveguide PIN-PD", Extended Abstracts (The 50th Spring Meeting, 2003); No. 3, '27 p-H-15', p. 1246, The Japan Society of Applied Physics and Related Societies.

(Continued)

*Primary Examiner*—Juliana Kang
(74) *Attorney, Agent, or Firm*—Leydig, Voit & Mayer, Ltd.

(57) ABSTRACT

Composition wavelengths of materials of cladding layers and optical guide layers are 0.92 μm and 1.2 μm respectively. When the thickness of optical guide layers, corresponding to an extreme value in which inclination of a sensitivity curve to 1.3 μm-wavelength light and to 1.55 μm-wavelength light with respect to a change in the thickness of each of both optical guide layers changes from positive to negative, are defined as d1 and d2, respectively, the thickness, dg, of optical guide layers of a light detecting element satisfies $0.75 d1 \leq dg \leq 1.25 d2$.

6 Claims, 3 Drawing Sheets

OTHER PUBLICATIONS

Ishimura et al.; "40Gbps Waveguide Photodiode for 1.3 μm/1.55 μm wavelength", Extended Abstracts (The 50th Spring Meeting, 2003); No. 3, '27 p-H-16', p. 1247, The Japan Society of Applied Physics and Related Societies.

* cited by examiner

WAVEGUIDE LIGHT DETECTING ELEMENT

BACKGROUND OF THE INVENTION

1. Field of the Invention

The present invention relates to a waveguide light detecting element, and particularly to a waveguide light detecting element used in an optical communication system or the like.

2. Description of the Related Art

With a leap increase in amount demanded for communications, an attempt to increase the capacity of a communication system has been made. To this end, however, there has been a need to speed up an optical communication apparatus and bring it into less size/high efficiency and less cost.

In an optical communication transmission system, lights lying in two wavelength bands have been used as signal lights. One of them is a signal light lying in a 1.3 μm band in which a center wavelength of a bandwidth of the signal light is 1.3 μm, and the other thereof is a signal light lying in a 1.55 μm band in which a center wavelength of a bandwidth of the signal light is 1.55 μm.

The 1.55 μm-band signal light is low in optical fiber loss and used as a signal light for a long-distance communication system. This is called interurban communication (trunk-line system) and is used for communications between large cities as in the case of Tokyo-to-Osaka, for example.

On the other hand, the 1.3 μm-band signal light is large in optical fiber loss but less in wavelength dispersion and is used as a signal light for a short-distance communication system. This is called an in-city communication and has been used in large city communication. Also the 1.3 μm-band signal light is used even in communications between an access system a base station and respective homes.

In an optical communication system, as a photodiode for receiving the signal lights lying in the two wavelength bands, a waveguide type semiconductor photodiode adaptable to one wavelength, which has been formed so as to be adapted to the lights lying in the respective wavelength bands, had been used.

As a known example of a conventional waveguide type light receiving element, there has been disclosed a configuration wherein an n-InGaAsP optical guide layer (bandgap wavelength: 1.3 μm), an InGaAs optical absorbing layer, a p-InGaAsP optical guide layer (bandgap wavelength: 1.3 μm), and a p-InP layer are sequentially laminated over an n conductivity type InP substrate (hereinafter an n conductivity type is represented as "n-", a p conductivity type is represented as "p-", and an intrinsic semiconductor is represented as "i-", respectively) (see, for example, section 0001 in Japanese Patent Application Laid-Open No. H10-125948).

As another known example, there has been disclosed a semiconductor light receiving element having a configuration wherein a material small in bandgap adapted to a 1.3 μm band and a 1.5 μm band is used for an optical absorbing layer to receive lights lying in the 1.3 μm band and 1.5 μm band well used in optical fiber communications, and a guide layer of n-InAlGaAs or n-InGaAsP, an avalanche-doubling layer of n-InAlAs, an electric field relaxation layer of p-InAlAs or p-InP, a low-concentration optical absorbing layer of p-InGaAs, a high-concentration optical absorbing layer of p-InGaAs, a p-type guide layer, and a p-type contact layer are sequentially laminated over an n-InP substrate to form a mesa stripe-shaped waveguide, which is covered with a passivation film of SiOx or SiNx (see, for example, sections 0023 to 0025 in Japanese Patent Application Laid-Open No. H11-330536).

As a further known example, there has been disclosed a mesa type having a double-core structure of an InGaAlAs system as a configuration of a 1.5 μm-light receiving wavelength band 10 Gb/s waveguide type PIN-PD, wherein In0.53Ga0.47As is used in an optical absorbing layer (see, for example, "Characteristics of light receiving wavelength-1.5 μm band 10 Gb/s waveguide PIN-PD", (The 50th Spring Lecture Proceedings (Kanagawa University, 2003.3), 2003 (Heisei 15th Year)); The Japan Society of Applied Physics, p.1246, 27p-H-15).

The conventional waveguide type light receiving element is configured as a photodiode adapted to a signal light lying in a single wavelength band used in its optical communication system. However, there is a possibility that a communication network maintained for in-city communications will be used as for interurban communications at this stage with enlargement of transmission capacity in the optical communication system. In this case, the optical communication apparatus employed in the optical communication system should be unavoidably complicated in configuration where optical parts adapted to respective wavelengths are used as at the present time.

However, even if an optical part adapted to the signal light of one wavelength, here a waveguide type photodiode (hereinafter called waveguide PD), the waveguide PD adapted to the one-wavelength signal light has received two-wavelength signal lights as it is, it was difficult to cause the waveguide PD to perform a high-speed operation at high sensitivity.

That is, the waveguide PD has a structure wherein light is confined in a waveguide portion having an optical absorbing layer and optical guide layers provided with the optical absorbing layer interposed therebetween, and the light is absorbed while the light confined in the waveguide portion is being propagated to the optical guide layers and the optical absorbing layer, and converted into an electric signal.

This waveguide PD confines the light in the waveguide portion and allows the waveguide portion to absorb the light by use of the difference in refractive index between the optical absorbing layer and each of the optical guide layers and cladding layers. Therefore, when the signal lights are different in wavelength from each other, the optical absorbing layer, optical guide layers and cladding layers adapted to the respective lights are different from one another in refractive index.

Thus, the waveguide PD corresponding to the single wavelength band is capable of optimizing a device structure in conformity with a light-receiving wavelength band. However, it happens that the waveguide PD corresponding to a multiwavelength is excellent in sensitivity characteristic at a certain wavelength but very poor in sensitivity characteristic at another wavelength. It can also happen that the sensitivity characteristic is degraded in all the wavelength bands in some cases.

For instance, as it is able to increase or improve confining of light in a waveguide by enlarging the difference in refractive index between an optical guide layer and a cladding layer, a composition wavelength on the long-wavelength side may preferably be selected from composition wavelengths in each of which a bandgap signal light passes through the optical guide layer, as the composition wavelength of the optical guide layer.

However, in order to cope with the multiwavelength, the optical guide layer must have a composition wavelength in which a signal light lying in the shortest wavelength band can pass through its corresponding optical guide layer. It can happen that if the composition wavelength of the optical guide layer is simply determined on the basis of the wavelength of the signal light lying in the shortest wavelength band, sensitivity is significantly degraded with respect to signal lights lying in other wavelength bands.

Thus, a problem arises in that even if the waveguide PD high in sensitivity and capable of high-speed operation corresponding to the signal light lying in the first wavelength band has received signal lights lying in a second wavelength band or other wavelength bands as it is, the waveguide PD encounters difficulties in enabling high sensitivity and high-speed operation with respect to these signal lights.

SUMMARY OF THE INVENTION

The present invention has been made to solve the above-described problems. A first object of the present invention is to configure a waveguide type light receiving element capable of high-speed operation at high sensitivity with respect to a multiwavelength signal light.

According to one aspect of the invention, there is provided a waveguide type light receiving element shared for a multiwavelength-band signal light comprising: a semi-insulating semiconductor substrate; and an optical waveguide layer disposed over the semiconductor substrate, the optical waveguide layer being formed by sequentially laminating from the semiconductor substrate side, a first conductivity type first cladding layer connected to a first electrode, a first conductivity type first optical guide layer, an optical absorbing layer, a second conductivity type second optical guide layer, and a second conductivity type second cladding layer connected to a second electrode, wherein when a center wavelength of a first signal light wavelength band corresponding to the shortest signal light wavelength band is defined as $\lambda 1$, a center wavelength of a second signal light wavelength band is defined as $\lambda 2$ ($\lambda 2 > \lambda 1$), and a composition wavelength of a material for each of the first and second cladding layers is defined as $\lambda a$, a composition wavelength $\lambda g$ of a material for each of the first and second optical guide layers satisfies $\lambda a < \lambda g < \lambda 1$ such that the first and second optical guide layers become transparent to the first signal light, wherein when the thickness of each of the first and second optical guide layers, corresponding to an extreme value in which an inclination of a sensitivity curve of $\lambda 1$ with respect to a change in the thickness of each of the first and second optical guide layers changes from positive to negative, is defined as d1, and the thickness of each of the first and second optical guide layers, corresponding to an extreme value in which an inclination of a sensitivity curve of $\lambda 2$ with respect to the change in the thickness of each of the first and second optical guide layers changes from positive to negative, is defined as d2, the thickness dg of the first and second optical guide layers satisfies $0.75d1 \leq dg \leq 1.25d2$.

Therefore, a high-speed operation is enabled with respect to a multiwavelength-band signal light containing the first and second signal light wavelength bands while high photo detecting sensitivity is being held.

Accordingly, It is thus possible to simply provide a waveguide type light receiving element shared for a multi-wavelength-band signal light, which is high in photo detecting sensitivity and capable of high-speed operation. By extension, an optical communication system becomes simple and hence an increase in capacity of the communication system can be put forward at low cost.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

A preferred embodiment of the invention described below will be explained using a built-in waveguide type PIN-PD sharing a 1.3 μm-band and a 1.55 μm-band for 40 Gbps as one example of a waveguide type light receiving element of an optical communication system.

First Embodiment

Figure 1:
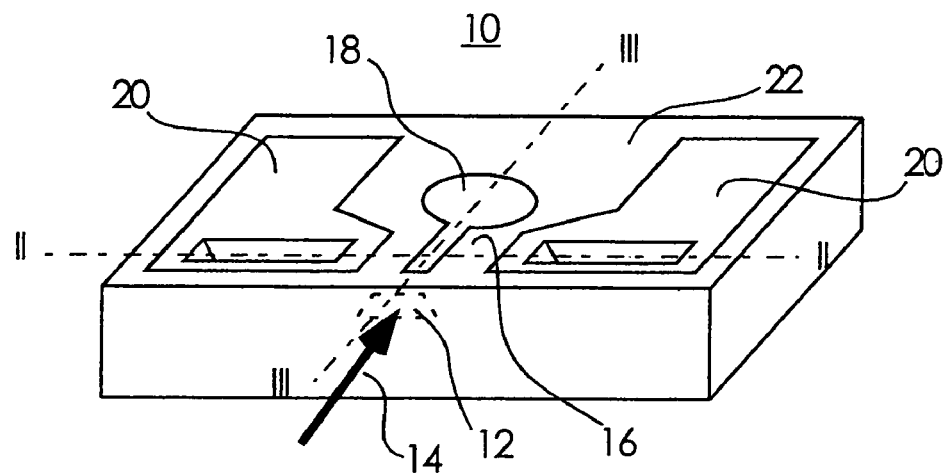
FIG. 1 is a perspective view of a waveguide light receiving element according to one embodiment of the present invention.

FIG. 1 is a perspective view of a waveguide type light receiving element according to one embodiment of the present invention.

In FIG. 1, the waveguide type PIN-PD 10 has a photodetector 12 provided at a frontal cleavage end face, which receives a signal light 14 indicated by arrow. The signal light 14 contains lights of two wavelength bands corresponding to a 1.3 μm band defined as a first signal light wavelength band in which a center wavelength $\lambda 1$ is 1.3 μm, and a 1.55 μm band defined as a second signal light wavelength band in which a center wavelength $\lambda 2$ is 1.55 μm.

A waveguide mesa 16 including a waveguide into which the signal light is introduced through the photodetector 12, is disposed on the upper surface side of the PIN-PD 10. A p electrode 18 is disposed along the surface of the waveguide mesa 16, and n electrodes 20 are disposed on both side surfaces of the waveguide mesa 16 and the upper surface of the PIN-PD 10. An upper surface other than the areas where the p electrode 18 and the n electrodes 20 are disposed, is covered with an insulating film 22.

Figure 2:
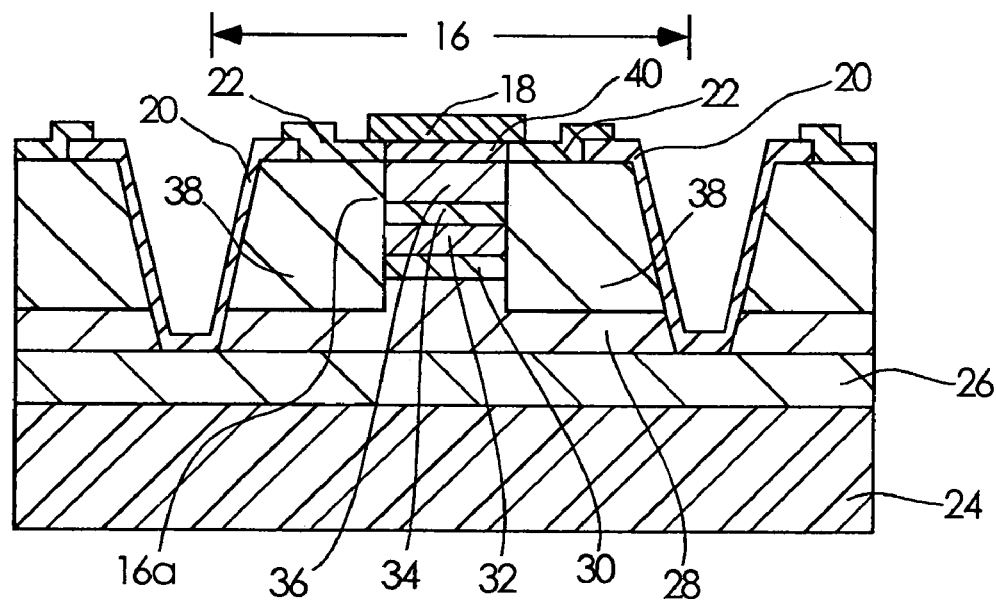
FIG. 2 is a cross-sectional view of a waveguide light detecting element as viewed in a cross-section taken along line II—II of FIG. 1.

FIG. 2 is a cross-sectional view of a waveguide type light receiving element as viewed in a cross-section taken along line II—II of FIG. 1. In other words, FIG. 2 is a cross-sectional view as seen in the direction that intersects the signal light and viewed in a cross-section orthogonal to the waveguide.

Figure 3:
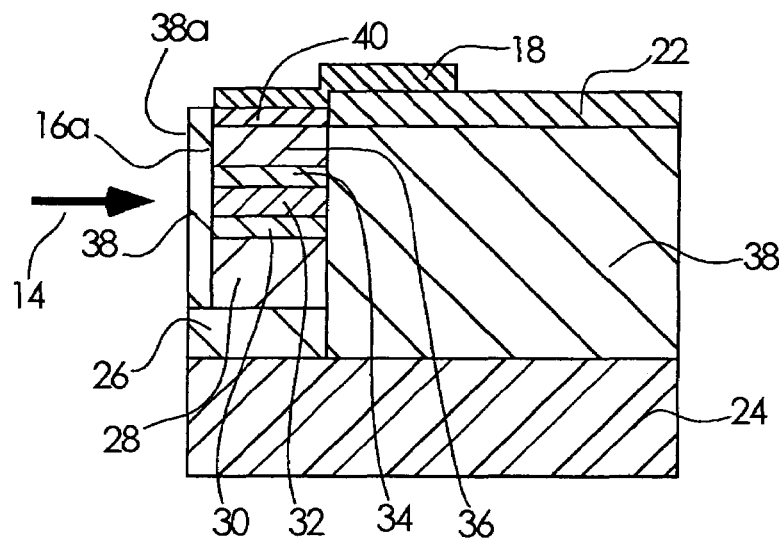
FIG. 3 is a cross-sectional view of the waveguide light detecting element as viewed in a cross-section taken along III—III of FIG. 1.

FIG. 3 is a cross-sectional view of the waveguide type light receiving element as viewed in a cross-section taken along III—III of FIG. 1. In other words, FIG. 3 is a cross-sectional view as seen in a cross-section taken along the traveling direction of the signal light and as viewed in a cross-section taken in the direction in which the waveguide extends. Incidentally, the same reference numerals in the figures correspond to the same ones or equivalent ones.

Referring to FIG. 2, an n-contact layer 26 composed of n-InGaAs is disposed on a semi-insulating Fe-doped InP substrate 24 used as a semi-insulating semiconductor substrate. The waveguide mesa 16 into which the signal light 14 is introduced through the photodetector 12, is disposed over the n-contact layer 26.

The waveguide mesa 16 includes a waveguide 16a used as an optical waveguide layer formed by sequentially laminating from the n-contact layer 26 side, an n-cladding layer 28 composed of n-InP, which is used as a first cladding layer disposed on the surface of the n-contact layer 26, an n-optical guide layer 30 composed of n-InGaAsP, which is used as a first optical guide layer disposed on the central surface of the n-cladding layer 28, an optical absorbing layer 32 composed of i-InGaAs, which is disposed on the surface of the n-optical guide layer 30, a p-optical guide layer 34 composed of p-InGaAsP, which is used as a second optical guide layer disposed on the surface of the optical absorbing layer 32, a p-cladding layer 36 composed of p-InP, which is used as a second cladding layer disposed on the surface of the p-optical guide layer 34, and a p-contact layer 40 composed of p-InGaAs, which is disposed on the surface of the p-cladding layer 36, and a block layer 38 composed of Fe-doped InP, which is disposed on both sides of the waveguide 16a excluding the p-contact layer 40 and used as a low refractive index layer that forms the side faces of the waveguide mesa 16.

The block layer 38 disposed on both sides of the waveguide 16a is formed of a material lower than the optical absorbing layer 32 in refractive index so that the difference in refractive index between the waveguide 16a and the block layer can be made large. Thus, the confining efficiency of light is enhanced and the light-receiving sensitivity of the light-receiving element can be increased.

Further, the p electrode 18 is disposed on the surface of the p-contact layer 40, and the n electrodes 20 brought into contact with the surface of the n-contact layer 26 are respectively disposed so as to cover both side faces of the block layer 38. The insulating film 22 is disposed on the surface of the waveguide mesa 16, which does not cover the p electrode 18 and the n electrodes 20. The p electrode 18 and the n electrodes 20 are electrically separated from one another with the insulating film 22 interposed therebetween.

Referring to FIG. 3, the block layer 38 composed of the Fe-doped InP, having a cleavage end face 38a is disposed on the frontal light-receiving side of the waveguide 16a. The block layer 38 composed of the Fe-doped InP is disposed even in the rear of the waveguide 16a. That is, the waveguide 16a is embedded in the block layer 38 composed of the Fe-doped InP and is cleaved in the block layer 38 and formed as a chip. The signal light is introduced into the waveguide 16a through the photodetector 12 provided at the cleaved end face of the block layer 38.

In the present embodiment, the length of the waveguide 16a, which extends in its longitudinal direction, i.e., the traveling direction of light, is 16 µm. The thickness of the n-cladding layer 28 is set to 1.5 µm, the thickness of the p-cladding layer 36 is set to 0.8 µm, and the thicknesses of the n-optical guide layer 30 and p-optical guide layer 34 are respectively set to 0.4 µm The thickness of the optical absorbing layer 32 can be brought into a broad band by shortening the traveling time of a carrier. Since, however, the absorption of the light is reduced when the thickness thereof is thinned, the thickness da of the optical absorbing layer 32 is represented as 0.3 µm≦da≦0.5 µm as a suitable range. In the present embodiment, however, da=0.5 µm.

A composition wavelength $\lambda a$ of InP used as the material for the n-cladding layer 28 and the p-cladding layer 36 was set to 0.92.

A composition wavelength $\lambda g$ of InGaAsP used as the material for the n-optical guide layer 30 and the p-optical guide layer 34 is larger than 0.92 corresponding to the refractive index of the material for the n-cladding layer 28 and the p-cladding layer 36. InGaAsP whose composition wavelength $\lambda g$ is 1.2 µm, was used in such a manner that it became transparent with respect to light of the 1.3 µm band, i.e., $\lambda g$ assumed $\lambda a < \lambda g < \lambda 1$, more desirably $\lambda a < \lambda g < 0.965 \lambda 1$.

As an n type impurity for each layer, the group IV element, e.g., Si, S or the like is added. The group II element, e.g., Be, Zn or the like is added as a p type impurity. The optical absorbing layer 32 of an intrinsic semiconductor layer is not added with an impurity in particular.

Thus, in the waveguide 16a, the p-optical guide layer 34, the n-optical guide layer 30 and the optical absorbing layer 32 interposed therebetween form a p/i/n junction.

An outline of a method for manufacturing the PIN-PD 10 according to the present embodiment will next be explained.

First, an n-InGaAs layer used as an n-contact layer 26, an n-InP layer used as an n-cladding layer 28, an n-InGaAsP layer used as an n-optical guide layer 30, i-InGaAs used as an optical absorbing layer 32, p-InGaAsP used as a p-optical guide layer 34, a p-InP layer used as a p-cladding layer 36, and a p-InGaAs layer used as a p-contact layer 40 are sequentially laminated over a semi-insulating Fe-doped InP substrate 24 by a chemical vapor deposition method, e.g., a MOCVD method.

Next, an $SiO_2$ film is formed on the surface of the p-InGaAs layer used as the p-contact layer 40 corresponding to the top layer in the laminated layer of these. A part of the insulating film corresponding to the upper surface of a waveguide 16a to be formed is left behind and insulating film patterns with openings around the part of the insulating film are formed. With the insulating film pattern as masks, the waveguide 16a is formed. At this time, the insulating film patterns are processed stepwise to thereby form portions to stop etching at places where the n-InP layer used as the n-cladding layer 28 is perfectly exposed, i.e., portions corresponding to the frontal surface and both side faces of the waveguide 16a, and a portion to be etched until the InP substrate 24 is exposed, i.e., a rear portion of the waveguide 16a.

Next, a damage layer formed upon dry etching is removed by wet etching, and the growth of embedding the waveguide 16a with Fe-doped InP is performed to form a block layer 38.

Next, an insulating film is formed and a waveguide mesa 16 is formed by wet etching. Then n electrodes 20 and an insulating film 22 are formed and a p electrode 18 is further formed.

Thereafter, the back surface of the InP substrate 24 is etched to a suitable thickness to form a back metal for bonding, whereby a wafer process is completed.

A description will next be made of a method of determining the thicknesses of the n-optical guide layer 30 and the p-optical guide layer 34 though the thicknesses of the n-optical guide layer 30 and the p-optical guide layer 34 have respectively been set to 0.4 μm in the PIN-PD 10 shared for the 1.3 μm band and 1.55 μm bands referred to above.

First of all, device's design values are set except for the thicknesses of the n-optical guide layer 30 and the p-optical guide layer 34. And then, in the case that the thicknesses of the n-optical guide layer 30 and the p-optical guide layer 34 are changed from 0.1 μm to 0.8 μm, the dependence of sensitivity on the thicknesses of optical guide layers relative to the respective signal lights whose wavelengths are 1.3 μm and 1.55 μm is determined through simulation performed by a BPM (beam propagation method) method.

Figure 4:
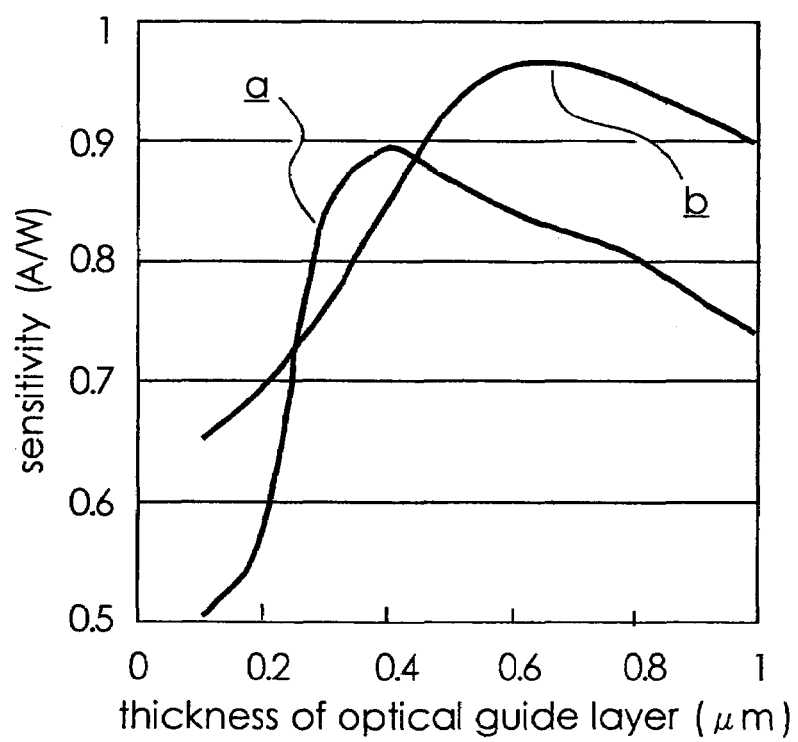
FIG. 4 is a graph showing the dependence of sensitivity to signal light on the thicknesses of optical guide layers of the waveguide light detecting element according to the one embodiment of the present invention.

FIG. 4 is a graph showing the dependence of sensitivity of signal lights on the thicknesses of optical guide layers of the waveguide type light receiving element according to the one embodiment of the present invention. In FIG. 4, a curve a shows the dependence of sensitivity on the thickness of an optical guide layer related to light whose wavelength is 1.3 μm, and a curve b shows the dependence of sensitivity on the thickness of an optical guide layer related to light whose wavelength is 1.55 μm, respectively.

In FIG. 4, the thicknesses d1 and d2 of the optical guide layers corresponding to extreme values in which the inclinations of the curves a and b change from positive to negative, are in the vicinity of 0.4 μm in the case of the curve a and in the vicinity of 0.6 μm in the case of the curve b, respectively. It is understood that the sensitivity degrades even when the optical guide layers become thin or thick from their thicknesses d1 and d2 corresponding to the extreme values.

Thus, it can be expected that the thickness dg of optical guide layers indicative of sensitivity satisfactory for both signal lights of a 1.3 μm band and a 1.55 μm band, for example, falls within a range of 0.4 μm≦dg≦0.6 μm, and the thicknesses of optical guide layers capable of becoming equal in sensitivity and both high in sensitivity with respect to the signal lights in the two wavelength bands exist. It can be expected that they exist in places where their thicknesses are slightly thick from 0.4 μm in FIG. 4.

Generally, in other words, it can be expected that if the thickness dg of first and second optical guide layers falls within a range of d1≦dg≦d2 when a center wavelength of a first signal light wavelength band corresponding to the shortest signal light wavelength band is defined as λ1, a center wavelength of a second signal light wavelength band is λ2 (λ2>λ1), the thickness of each of the first and second optical guide layers, corresponding to an extreme value in which the inclination of a sensitivity curve of λ1 with respect to a change in the thickness of each of the first and second optical guide layers changes from positive to negative, is defined as d1, and the thickness of each of the first and second optical guide layers, corresponding to an extreme value in which the inclination of a sensitivity curve of λ2 with respect to the change in the thickness of each of the first and second optical guide layers changes from positive to negative, is defined as d2, the thicknesses of the optical guide layers capable of becoming equal in sensitivity and both high in sensitivity with respect to a multiwavelength signal light contained between the first signal light and the second signal light exist.

Since, however, the sensitivity curves respectively gently change with respect to the changes in the thicknesses of the optical guide layers in the vicinity of the extreme values, the thickness of the optical guide layers can be set to within, substantially, a range of 0.3 μm≦dg≦0.75 μm, generally, in other words, a range of 0.75d1≦dg≦1.25d2 without any problem substantially.

Figure 5:
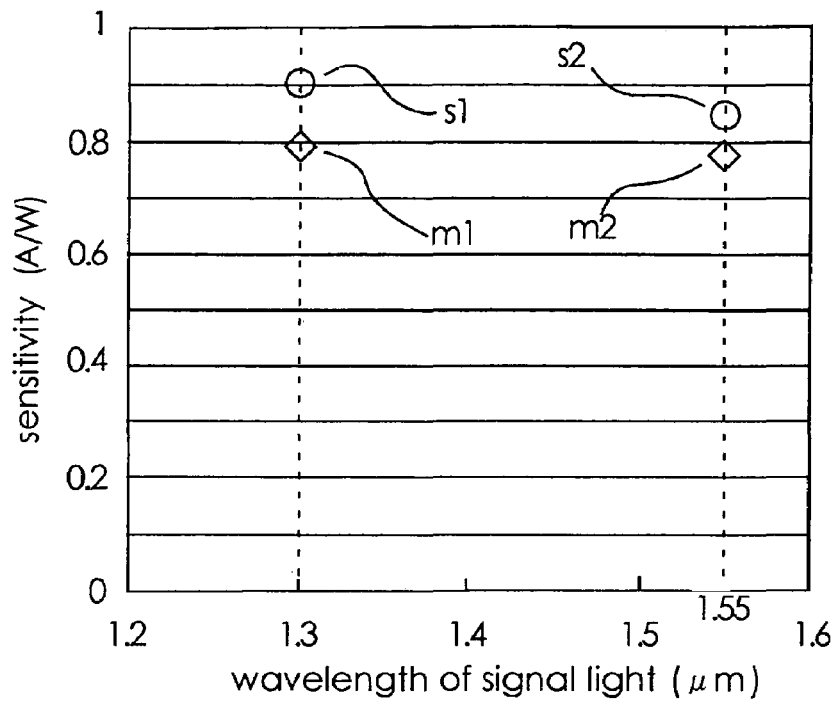
FIG. 5 is a graph showing comparisons between calculated values and actually measured values of sensitivity characteristics of a waveguide light detecting element according to the one embodiment of the present invention.

FIG. 5 is a graph showing comparisons between calculated values and actually measured values of sensitivity characteristics of the waveguide type light receiving element according to the one embodiment of the present invention.

In FIG. 5, s1 indicates a sensitivity calculated value with respect to the signal light lying in the 1.3 μm band, and s2 indicates a sensitivity calculated value with respect to the signal light lying in the 1.55 μm band. Further, m1 indicates a sensitivity actually-measured value with respect to the signal light in the 1.3 μm band, and m2 indicates a sensitivity actually-measured value with respect to the signal light lying in the 1.55 μm band.

As understood from the sensitivity actually-measured values m1 and m2, an element having a sensitivity characteristic of about 0.8 A/W is obtained, and the sensitivity calculated values and the sensitivity actually-measured values approximately coincide with one another.

Figure 6:
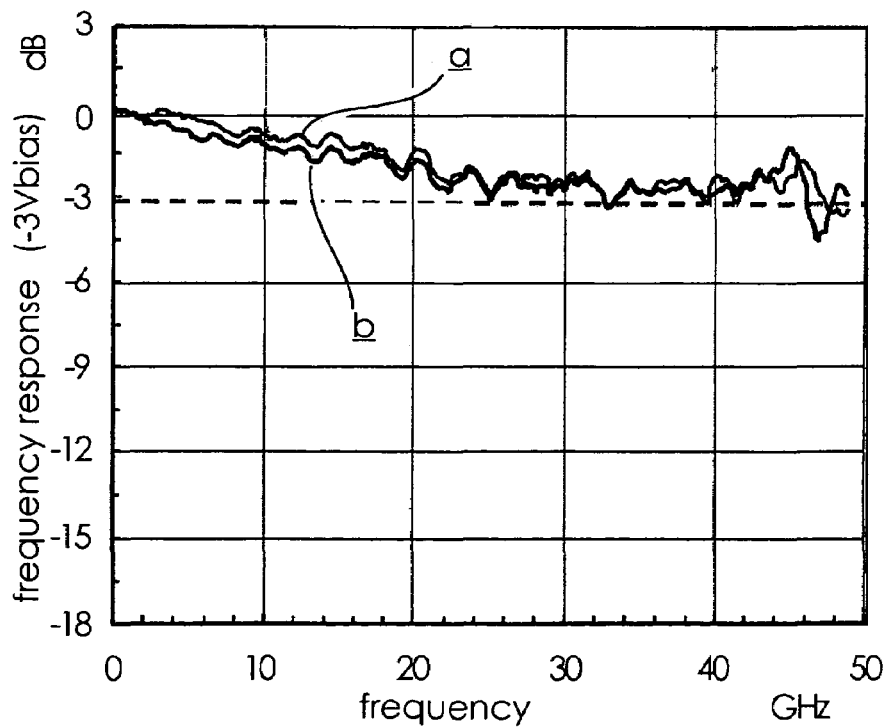
FIG. 6 is a graph showing frequency responses of the waveguide light detecting element according to the one embodiment of the present invention.

FIG. 6 is a graph showing frequency responses of the waveguide type light receiving element according to the one embodiment of the present invention.

In FIG. 6, a curve a indicates the response with respect to the signal light lying in the 1.3 μm band, and a curve b indicates the response with respect to the signal light lying in the 1.55 μm band. As is understood from FIG. 6, the bandwidth becomes broad because the thickness da of the optical absorbing layer 32 is formed thin.

While the above description has been made of the embedded waveguide type PIN-PD using the InGaAsP material, an AlInGaAsP material and a GaInNAs material may be used in addition to an InGaAsP material.

Since these materials are mixed crystals containing a plurality of elements, their lattice constants and bandgaps can be changed. Therefore, they are made identical to the substrate material in lattice constant, and the bandgaps can be changed in a very wide range. Therefore, the degree of freedom of design becomes high and a higher sensitive light receiving element can be designed.

The InGaAsP material is a material system which has been investigated and developed from a long time ago and is currently the most common material as the material for the light receiving element for communication. A stable characteristic can easily be obtained.

At the mention of the AlInGaAsP materials, the cladding layer, optical guide layers and optical absorbing layer are respectively constituted by using materials such as InAlAs, InGaAlAs and InGaAs to thereby make it possible to obtain a predetermined refractive index difference, whereby a similar effect can be obtained.

Even a GaInNAs material is changed in composition ratio so that a predetermined refractive index difference is obtained, thus making it possible to obtain a similar effect. A PD using the GaInNAs material can cope with a wider range of bandgap wavelength as compared with a PD using the InGaAsP material or the AlInGaAsP material.

Although the description of the above embodiment has been made of the PIN-PD by way of example, the present invention may be applied to a light receiving element having the action of amplifying a signal therewithin, e.g., an element having the function of receiving light and amplifying a converted electric signal, like an APD (avalanche photodiode) having a doubling or multiplication layer therewithin, a light receiving element in which SOA (semiconductor optical amplifiers) each having the function of amplifying a light signal are disposed at the frontal surface of a photodetector, etc. to obtain a similar effect.

In particular, the AlInGaAsP material is used for the APD and brings about the effect of reducing noise as compared with the InGaAs material when a signal is amplified. It is thus possible to fabricate an APD higher in photo detecting sensitivity.

It is needless to say that a device brought into module form by mounting the above-described element also has a similar effect.

In the multiwavelength-shared embedded waveguide type PIN-PD according to the present embodiment as described above, when the thickness of each of the n- and p-optical guide layers, corresponding to the extreme value in which the inclination of the sensitivity curve of the light of the wavelength $\lambda 1$ with respect to the change in thickness of each of the n- and p-optical guide layers changes from positive to negative, is defined as d1 and the thickness of each of the n- and p-optical guide layers, corresponding to the extreme value in which the inclination of the sensitivity curve of the light having the wavelength $\lambda 2$ with respect to the change in the thickness of each of the n- and p-optical guide layers changes from positive to negative, is defined as d2 where the center wavelength of the 1.3 μm-band signal light is defined as $\lambda 1$, and the center wavelength of the 1.55 μm-band signal light is defined as $\lambda 2$, the thickness dg of the n- and p-optical guide layers of the waveguide type PIN-PD satisfies $0.75d1 \leq dg \leq 1.25d2$. Consequently, a high-speed operation is enabled with respect to the multiwavelength-band signal light containing the 1.3 μm-band signal light and 1.55 μm-band signal light while high photo detecting sensitivity is being held. It is thus possible to simply configure a waveguide type light receiving element shared for a multiwavelength-band signal light, which is high in photo detecting sensitivity and capable of high-speed operation. By extension, an optical communication system becomes simple, and an increase in capacity of the communication system can be put forward at low cost.

Further, when the thickness of the optical absorbing layer is defined as da, it is set so as to satisfy $0.3 \, \mu m \leq da \leq 0.5 \, \mu m$. Owing to this constitution, the traveling time of a carrier can be suppressed and an increase in bandwidth is enabled. By extension, a broad-band light receiving element can be simply configured. It is by extension possible to bring a communication system into a broad band and easily put forward an increase in capacity of the system.

Furthermore, each of the n- and p-cladding layers is formed of InP, and the composition wavelength $\lambda g$ of the material for each of the n- and p-optical guide layers is fixed with the composition wavelengths of the material for each of the n- and p-cladding layers as $\lambda a = 0.92 \, \mu m$ and $\lambda 1 = 1.3 \, \mu m$. With $\lambda 2 = 1.55 \, \mu m$, the thickness dg of the n- and p-optical guide layers is set so as to satisfy $0.3 \, \mu m \leq dg \leq 0.75$ with $d1 = 0.4 \, \mu m$ and $d2 = 0.6 \, \mu m$. Owing to such a constitution, a high-speed operation is enabled with respect to the multi-wavelength-band signal light containing the 1.3 μm-band signal light and 1.55 μm-band signal light while high photo detecting sensitivity is being held.

Moreover, the block layer composed of Fe-doped InP corresponding to the material lower in refractive index than the optical absorbing layer composed of i-InGaAs is disposed on the side surfaces of the waveguide. Owing to this configuration, the confining efficiency of light can be enhanced. It is therefore possible to improve the confining efficiency of light and increase photo detecting sensitivity of a light receiving element. By extension, a waveguide type PIN-PD high in photo detecting sensitivity can be provided in a simple configuration.

While the presently preferred embodiments of the present invention have been shown and described. It is to be understood these disclosures are for the purpose of illustration and that various changes and modifications may be made without departing from the scope of the invention as set forth in the appended claims.

The invention claimed is:

1. A waveguide light detecting element for detecting multiwavelength-band signal light, comprising:

a semi-insulating semiconductor substrate; and an optical waveguide layer supported by the semiconductor substrate, said optical waveguide layer including, sequentially laminated from the semiconductor substrate side, a first conductivity type first cladding layer connected to a first electrode, a first conductivity type first optical guide layer, an optical absorbing layer, a second conductivity type second optical guide layer, and a second conductivity type second cladding layer connected to a second electrode, wherein, when a center wavelength of a first signal light wavelength band, corresponding to a shortest signal light wavelength band is defined as $\lambda 1$, a center wavelength of a second signal light wavelength band is defined as $\lambda 2$ ($\lambda 2 > \lambda 1$), and a composition wavelength of a material for each of the first and second cladding layers is defined as $\lambda a$, composition wavelength, $\lambda g$, of a material of each of the first and second optical guide layers satisfies $\lambda a < \lambda g < \lambda 1$ so that the first and second optical guide layers are transparent to the first signal light, when the thickness of each of the first and second optical guide layers, corresponding to an extreme value in which inclination of a sensitivity curve of $\lambda 1$ with respect to a change in the thickness of each of the first and second optical guide layers changes from positive to negative, is defined as d1, and the thickness of each of the first and second optical guide layers, corresponding to an extreme value in which inclination of a sensitivity curve of $\lambda 2$ with respect to the change in the thickness of each of the first and second optical guide layers changes from positive to negative, is defined as d2, the thickness, dg, of the first and second optical guide layers satisfies $0.75d1 \leq dg \leq 1.25d2$, and each of the first and second cladding layers is InP, the composition wavelength $\lambda g$ of each of the first and second optical guide layers is fixed, the composition wavelength of the first and second cladding layers, $\lambda a$, is 0.92 μm, $\lambda 1 = 1.3$ μm, $\lambda 2 = 1.55$ μm, and the thickness, dg, of the first and second optical guide layers satisfies $0.3 \, \mu m \leq dg \leq 0.75 \, \mu m$ with $d1 = 0.4$ μm and $d2 = 0.6$ μm.

2. The waveguide light detecting element according to claim 1, wherein, when the thickness of the optical absorbing layer is defined as da, $0.3 \, \mu m \leq da \leq 0.5 \, \mu m$.

3. The waveguide light detecting element according to claim 1, wherein each of the first and second optical guide layers is InGaAsP.

4. The waveguide light detecting element according to claim 1, wherein each of the first and second optical guide layers is AlInGaAsP.

5. The waveguide light detecting element according to claim 1, wherein each of the first and second optical guide layers is GaInNAs.

6. The waveguide light detecting element according to claim 1, including a low refractive index layer of a material lower than the optical absorbing layer in refractive index disposed on side faces of a waveguide.

* * * * *